UNITED STATES PATENT OFFICE.

MAX RÜPING, OF CHARLOTTENBURG, GERMANY, ASSIGNOR TO HÜLSBERG & CO. GESELLSCHAFT MIT BESCHRÄNKTER HAFTUNG, OF FRANKFORT-ON-THE-MAIN, GERMANY, A FIRM.

METHOD OF IMPREGNATING WOOD, &c.

No. 12,707. Specification of Reissued Letters Patent. Reissued Oct. 22, 1907.

Original No. 709,799, dated September 23, 1902, Serial No. 100,862. Application for reissue filed June 8, 1907. Serial No. 378,044.

*To all whom it may concern:*

Be it known that I, MAX RÜPING, a subject of the German Emperor, residing at Charlottenburg, Prussia, Germany, have invented certain new and useful Improvements in Methods of Impregnating Wood; and I do hereby declare the following to be a full, clear, and exact description of the invention, such as will enable others skilled in the art to which it appertains to make and use the same.

My present invention relates to the impregnating of porous materials—such as, for instance, fabrics, wood, peat, paper, felt, artificial stone, and the like.

The methods hitherto used had the object of filling up the cells or pores and hollow spaces with the impregnating liquid, while in contradistinction thereto it is the object of the present invention not to fill or to stop up the cells, pores, and cavities, but only to impregnate their walls with the impregnating liquid or to provide them with a coating of the latter and to leave the cells, cavities, or the like empty. This effect could up to the present time only be obtained after a long drying process, while with certain impregnating agents it could not be obtained at all.

In comparison with previous methods the present invention has many advantages. The first advantage consists in the use of less impregnating liquid than has previously been possible. Moreover, a product having many good qualities is obtained, as according to the present method the impregnated material dries very quickly.

The present invention has not only general advantages, but it is particularly very convenient if it is desired to effect a repeated impregnation of the material with different solutions and if, for instance, it is desired to effect a precipitation in the cells or an incrustation on the cell-walls by means of a second solution. In such cases the impregnation with the second liquid can take place immediately after the impregnation with the first solution, as in consequence of the foregoing treatment the spaces for receiving the second impregnating liquid are ready in the interior of the cells.

The method consists in first subjecting the material to be impregnated for a certain time—say half an hour or longer—to an air-pressure of, for instance, five atmospheres or to the pressure of another gas, in a closed receptacle, so that all the cells and cavities are filled with compressed gas, after which, while maintaining the air or gas pressure, the impregnating liquid under a still higher pressure is introduced into the receptacle in which the material treated is placed. In proportion to the quantity of the impregnating liquid entering the receptacle, air is allowed to escape in order to make room for the required quantity of liquid. The material being completely covered with the liquid, the pressure can be raised—for instance, to fifteen atmospheres—whereby the liquid is forced to quickly penetrate the cells. This occupies one or more hours, according to the nature of the material to be impregnated and to the amount of pressure employed for the impregnating liquid. The pressure is then cut off and the impregnating liquid is discharged, the pressure having fallen to atmospheric pressure, or a vacuum can, besides, be produced in the receptac e The effect of this new method can be explained by the various cells, pores, or cavities in the material to be impregnated in the first instance, being filled under the pressure with the compressed air or th gas employed and at a corresponding pressure. If ow the impregnating liquid is introduced into the material under an increased pressure, the impregnating liquid penetrates into the cells and settles down on the walls of the latter, thus further compressing the gas, which pressure in the present example would amount to fifteen atmospheres. By reducing the pressure of the impregnating liquid to atmospheric pressure the quantity of highly-compressed air contained in each single cell, pore, or cavity will press the impregnating liquid which does not adhere to the walls out of the cells and cause it to escape. Consequently no more impregnating liquid can be retained in the material to be impregnated than is necessary for the impregnation and coating of the walls of the cells, and the separate cells, etc., do not remain filled with impregnating liquid but with air or the gas, which, rapidly drying, oxidizing, or hardening, acts on the impregnated walls. The escape of the impregnating liquid will of course be still further aided by the impregnated material being subjected to the influence of a vacuum.

It must be particularly noted that according to the present invention preliminary treatment of the material by steam is not necessary. However, in certain cases it can also be made use of. The pressure employed can in the present method be so regulated that a greater or smaller amount of the impregnating liquid is retained in the cells of the material to be impregnated. Any desired impregnating material or materials may be used, but I prefer to use creosote oil, or creosote.

I claim—

1. The method of impregnating wood and other porous material, which consists in subjecting the material to be treated, to a strong gas pressure in a closed vessel, whereby the cells, pores, or cavities of said material are filled with highly compressed gas, then subjecting the material to the action of an impregnating liquid at a still higher pressure, and then reducing the pressure, whereupon the compressed gas presses the excess of impregnating liquid out of the cells, pores, or cavities of the material, substantially as described.

2. The method of impregnating wood and other porous material, which consists in subjecting the material to be treated, to a strong gas pressure in a closed vessel, whereby the cells, pores, or cavities of said material are filled with highly compressed gas, then subjecting the material to the action of an impregnating liquid at a still higher pressure and then creating a vacuum in the vessel, whereby the compressed gas presses the excess of impregnating liquid out of the cells, pores, or cavities of the material, substantially as described.

MAX RÜPING.

Witnesses:
HENRY HASPER,
WOLDEMAR HAUPT.